United States Patent
Rupp et al.

(10) Patent No.: US 8,605,774 B2
(45) Date of Patent: Dec. 10, 2013

(54) AMPLITUDE/PHASE DELAY CALIBRATION FOR ENVELOPE-TRACKING AMPLIFIER

(75) Inventors: Craig E. Rupp, Ames, IA (US); Gerardo Orozco Valdes, Austin, TX (US); Abram H. Rose, IV, Austin, TX (US)

(73) Assignee: National Instruments Corporation, Austin, TX (US)

( * ) Notice: Subject to any disclaimer, the term of this patent is extended or adjusted under 35 U.S.C. 154(b) by 276 days.

(21) Appl. No.: 13/072,135

(22) Filed: Mar. 25, 2011

(65) Prior Publication Data
US 2012/0243592 A1    Sep. 27, 2012

(51) Int. Cl.
*H04B 3/46* (2006.01)

(52) U.S. Cl.
USPC ........... 375/224; 375/232; 375/297; 375/298; 375/308

(58) Field of Classification Search
USPC ......... 375/224, 226, 227, 296, 267, 300, 232, 375/297, 298, 308
See application file for complete search history.

(56) References Cited

U.S. PATENT DOCUMENTS

| 7,359,680 B2 | 4/2008 | Klemmer |
| 7,522,676 B2 | 4/2009 | Matero |
| 7,605,625 B2 | 10/2009 | Pellerano et al. |
| 2007/0142005 A1* | 6/2007 | Sundstrom .................... 455/126 |

* cited by examiner

*Primary Examiner* — Kabir A Timory
(74) *Attorney, Agent, or Firm* — Meyertons Hood Kivlin Kowert & Goetzel, P.C.; Mark K. Brightwell

(57) ABSTRACT

A system and method for estimating a time delay introduced by an envelope tracking amplifier (ETA) of a transmitter. The ETA receives a first baseband signal that is generated by the transmitter and operates on the first baseband signal to produce an output signal. The receiver receives a second baseband signal in response to the transmitter's transmission of the output signal. The receiver generates a model signal that represents an estimate of the first baseband signal. The receiver computes a first time delay between the amplitude envelopes of the second baseband signal and the model signal. The receiver computes a second time delay between phase signals derived respectively from the second baseband signal and the model signal. The receiver estimates the time delay that is introduced by the ETA of the transmitter by subtracting the second time delay from the first time delay.

20 Claims, 10 Drawing Sheets

AMPLITUDE/PHASE DELAY CALIBRATION FOR ENVELOPE-TRACKING AMPLIFIER

FIELD OF THE INVENTION

The present invention relates to the field of telecommunication, and more specifically, to systems and methods for estimating the amount by which the amplitude envelope of a baseband signal is delayed by an envelope tracking amplifier of a transmitter.

DESCRIPTION OF THE RELATED ART

Given a major focus in portable electronics to reduce power consumption, much attention has been given to linearization techniques such as envelope extraction and restoration with class E amplifiers. One such technique is illustrated by the envelope-tracking amplifier of FIG. 1. The envelope-tracking amplifier receives a baseband signal $s(t)=a(t)\exp(j\phi(t))$. Unit 110 extracts the phase signal $\exp(j\phi(t))$ from the signal $s(t)$. Unit 115 extracts the envelope $a(t)$ from the signal $s(t)$. The phase signal $\exp(j\phi(t))$ is supplied to a quadrature modulator 120, and the output of the quadrature modulator is supplied to the input of a power amplifier 130. Furthermore, the envelope $a(t)$ modulates a switched-mode power supply 125. The output $w(t)$ of the power supply is provided to the supply input of the power amplifier 130.

There is an inherent issue with the envelope-tracking amplifier detailed in FIG. 1 that must be addressed in manufacturing a device employing this technology. With any analog circuitry such as a switched-mode power supply, there is an inherent delay $\Delta t$ in the generation of the power supply signal $w(t)$ that varies from circuit to circuit, hence device to device. In order to compensate for this delay, the phase signal $\exp(j\phi(t))$ should be delayed by the same amount, as shown in FIG. 2. (See the delay unit 117.) The delayed signal is represented by the expression $\exp(j\phi(t-\Delta t))$. As a result of this compensating delay, the amplitude and phase of the resultant signal $v(t)$ from the power amplifier 130 will be completely aligned:

$$v(t)=GRe\{a(t-\Delta t)\exp(j\phi(t-\Delta t))\},$$

where $Re\{z\}$ denotes the real part of complex quantity $z$, where $G$ is a gain factor.

Prior Art Delay Calibration Method

As part of the calibration of a unit under test (UUT), manufacturers employ a trial-and-error method to estimate the delay $\Delta t$. For example, the trial-and-error method may include: (a) programming the delay unit 117 to zero delay; (b) forming the signal $$s(t)=a(t)\exp\{j\phi(t-\tau)\}$$

where a delay $\tau$ is applied to the phase signal $\phi(t)$; (c) applying the signal $s(t)$ to the envelope-tracking amplifier; (d) measuring the spectral emission from the envelope-tracking amplifier; and repeating steps (b), (c) and (d) in order to minimize the measured spectrum.

Given the signal $s(t)=a(t)\exp\{j\phi(t-\tau)\}$ as input to the envelope-tracking amplifier, the spectral emission from the envelope-tracking amplifier may be modeled by the Fourier transform of the complex signal $a(t-\Delta t)\exp\{j\phi(t-\tau)\}$, which has the form:

$$A(\omega)\exp(-j\omega\Delta t)* \mathcal{F}\{\exp(j\phi(t))\}\exp(-j\omega\tau),$$

where "*" denotes convolution, where $\mathcal{F}$ denotes the Fourier transform. Analyzing this spectrum, it is apparent that the spectral characteristics of the complex signal are altered as the delay $\tau$ is varied. Moreover, as the delay $\tau$ greatly deviates from $\Delta t$, the more the spectrum will depart from DC. Manufacturers are using this phenomenon to estimate the delay $\Delta t$, i.e., by adjusting the delay $\tau$ to center and minimize the emissions. A representative plot of such a measurement is shown in FIG. 3. In this example, the emissions are minimized for delay settings near 106. The horizontal axis represents delay $\tau$ in units of $10^{-7}$ seconds (i.e., tenths of microseconds). The vertical axis represents the emissions power in dBc.

Shortcomings

With the procedure detailed above, manufacturers are relying on a Spectral Emissions (SEM) test result as their figure-of-merit. Assuming the instrument can measure real time, the time required to measure SEM on a single band given N averages is given as:

$$T_{se}=NT_f+T_c,$$

where $T_f$ is the frame time and $T_c$ is the configuration time. With K bands and M delays, the total time $T_c$ required to calibrate is then:

$$T_c=KM(T_{se})=KM(NT_f+T_c).$$

For a quad-band cellular radio (K=4), eleven delay steps (M=11), 100 averages (N=100), and a 10 msec configuration and programming time ($T_c$=10 msec), the total time required to calibrate and verify the output power is:

$$\begin{aligned}T_c &= KM(NT_f+T_c)\\ &= 4*11*(100*4.615\text{ msec}+10.0\text{ msec})\\ &= 20.746\text{ sec.}\end{aligned}$$

Thus, there exists a need for improved mechanisms for estimating the amplitude delay $\Delta t$ of the envelope-tracking amplifier.

SUMMARY

In some embodiments, a receiver may receive signal transmissions from a transmitter that includes an envelope tracking amplifier. The envelope tracking amplifier is configured to receive a first baseband signal that is generated by the transmitter (e.g., as a result of modulating a stream of information bits). The envelope tracking amplifier operates on the first baseband signal to produce an output signal, which is transmitted onto a channel. The receiver may be configured to estimate a certain time delay introduced by the envelope tracking amplifier, i.e., the time delay between the amplitude envelope of the output signal and the amplitude envelope of the first baseband signal. In one embodiment, the estimation process may involve the following operations.

The receiver may receive a second baseband signal from the channel in response to the transmitter's transmission of the output signal onto the channel.

The receiver may generate a model signal that represents an estimate of the first baseband signal by modulating a sequence of information bits, e.g., a sequence of bits obtained by demodulating the second baseband signal, or perhaps, a stored sequence of information bits that is known to be the same as the information bits used by the transmitter to generate the first baseband signal.

The receiver may compute a first time delay between an amplitude envelope of the second baseband signal and an amplitude envelope of the model signal, e.g., by performing a time-domain correlation and analyzing the correlation, or equivalently, computing a cross spectrum and analyzing the cross spectrum.

The receiver may compute a second time delay between a phase signal derived from the second baseband signal and a phase signal derived from the model signal. As with the first time delay, the second time delay may be computed based on a time-domain analysis or a frequency-domain analysis.

The receiver may estimate the time delay that is introduced by the envelope tracking amplifier of the transmitter by subtracting the second time delay from the first time delay. The estimated time delay value may be used to program a delay compensation mechanism of the transmitter. That mechanism is responsible for compensating for the time delay that is introduced by the envelope tracking amplifier so that during a normal operation the amplitude and phase will be in phase at the output of the amplifier.

In one embodiment, a method for operating a receiver may involve the following operations. The receiver receives signal transmissions from a transmitter that includes an envelope tracking amplifier. The envelope tracking amplifier is configured to receive a first baseband signal that is generated by the transmitter and to operate on the first baseband signal to produce an output signal.

The method includes receiving a mode selection input from a control unit, e.g., a computer system.

The method also includes receiving a trigger signal from the control unit, where the trigger signal indicates a start time of the first baseband signal at the transmitter.

The method also includes receiving a second baseband signal from a channel in response to the transmitter's transmission of the output signal onto the channel.

The method also includes generating a model signal that represents an estimate of the first baseband signal by modulating a sequence of information bits in response to receiving the trigger signal.

The method also includes computing either an amplitude time delay or a phase delay time depending on a state of the mode selection input. The action of computing the amplitude time delay includes computing a time delay between an amplitude envelope of the second baseband signal and an amplitude envelope of the model signal. The action of computing the phase time delay includes computing a time delay between a phase signal derived from the second baseband signal and a phase signal derived from the model signal.

The computed time delay may be sent (or made available) to the control unit. The computed time delay may be used to program the delay compensation mechanism of the transmitter.

BRIEF DESCRIPTION OF THE DRAWINGS

A better understanding of the present invention can be obtained when the following detailed description of the preferred embodiments is considered in conjunction with the following drawings.

Figure 1:
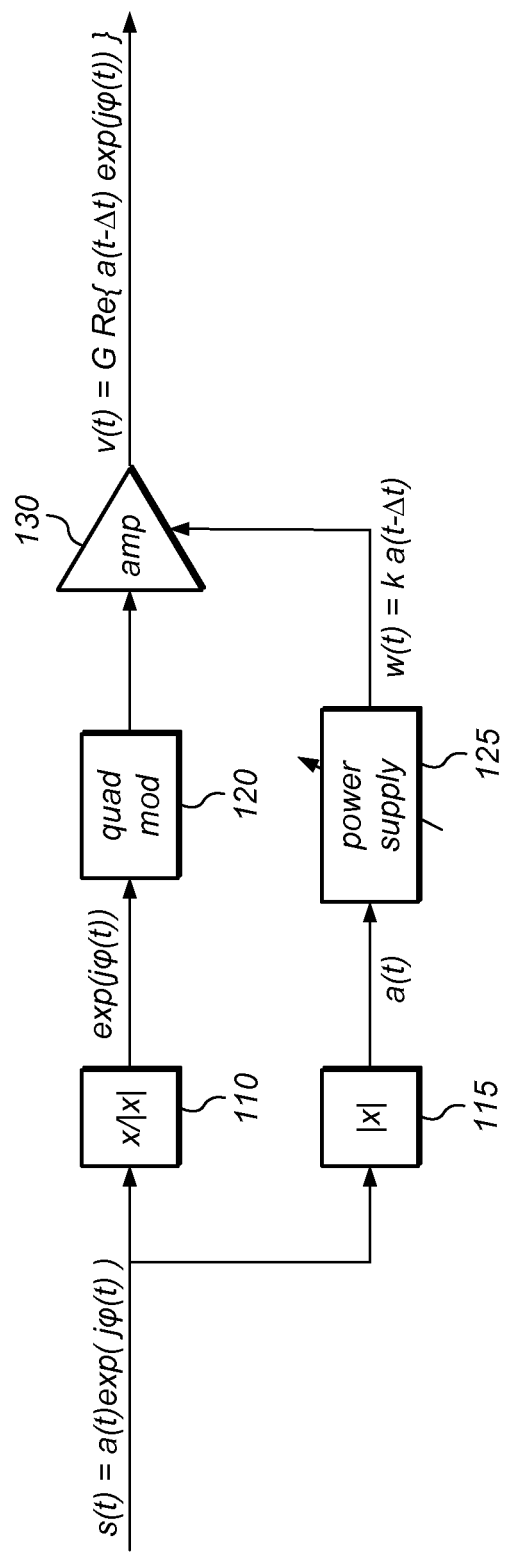
FIG. 1 illustrates an envelope-tracking amplifier according to the prior art.
Figure 2:
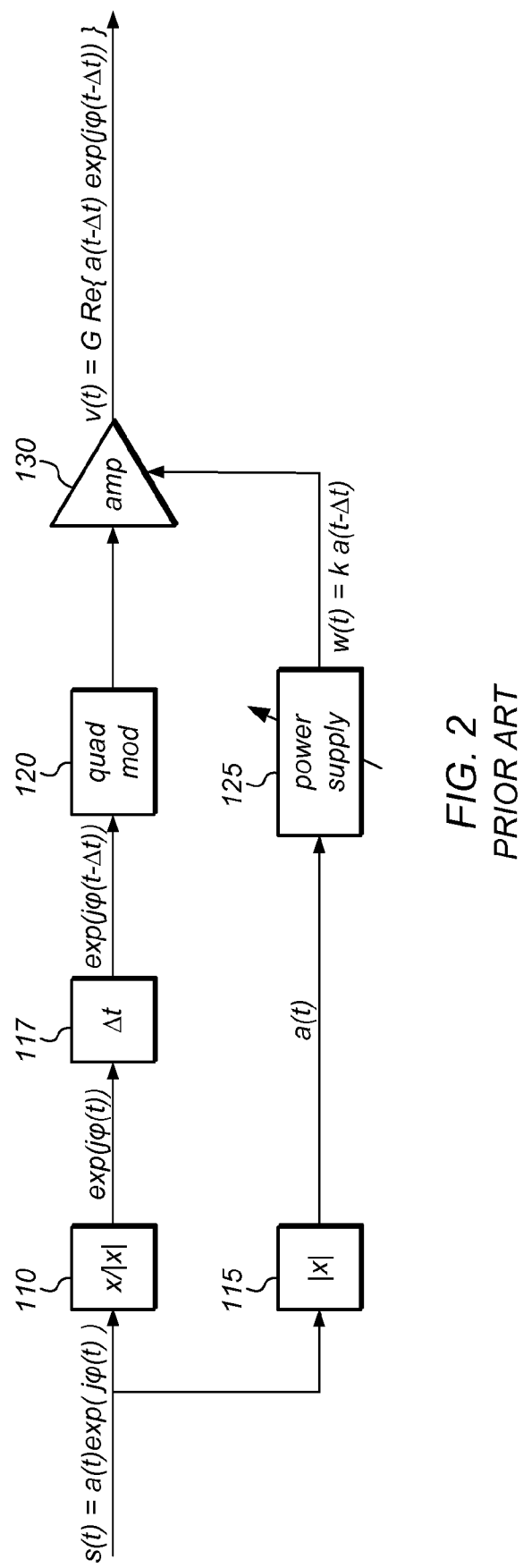
FIG. 2 illustrates a prior art envelope-tracking amplifier that includes a delay unit. The delay unit is configured to introduce delay in a phase path, in order compensate for delay introduced by the amplitude path by the switched mode power supply.
Figure 3:
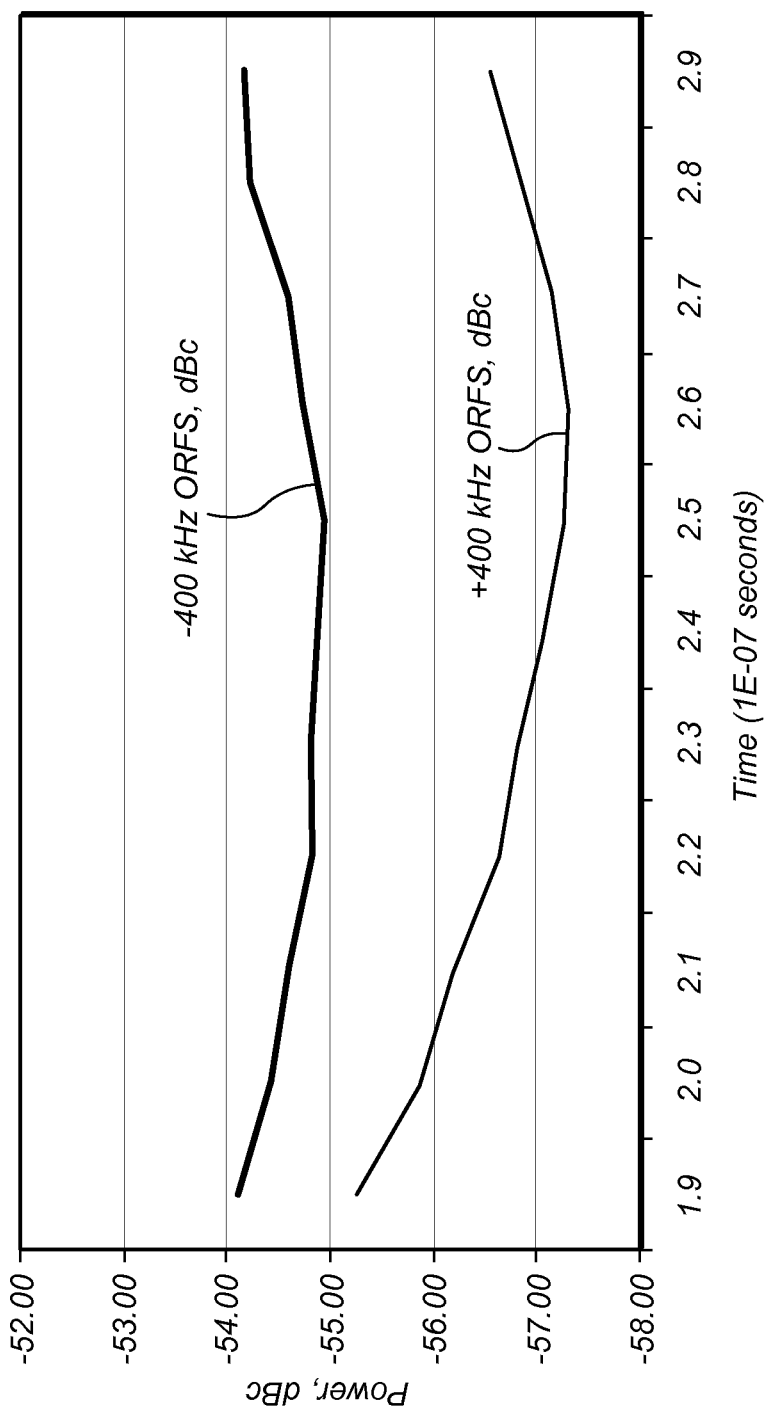
FIG. 3 illustrates a prior art process of estimating the time delay introduced into the amplitude path by the envelope tracking amplifier by minimizing a spectrum emission measure.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Terminology

The following is a glossary of terms used in the present document.

Memory Medium—A memory medium is a medium configured for the storage and retrieval of information. Examples of memory media include: various kinds of semiconductor memory such as RAM and ROM; various kinds of magnetic media such as magnetic disk, tape, strip and film; various kinds of optical media such as CD-ROM and DVD-ROM; various media based on the storage of electrical charge and/or other physical quantities; media fabricated using various lithographic techniques; etc. The term "memory medium" may also include a set of two or more memory media which reside at different locations, e.g., at different computers that are connected over a network.

Programmable Hardware Element—a hardware device that includes multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Program—the term "program" is intended to have the full breadth of its ordinary meaning. As used herein, the term "program" includes within its scope of meaning: 1) a software program which is stored in a memory and is executable by a processor, or, 2) a hardware configuration program useable for configuring a programmable hardware element. Any of the method embodiments described herein, or, any combination of the method embodiments described herein, or, any subset of any of the method embodiments described herein, or, any combination of such subsets may be implemented in terms of one or more programs.

Software Program—the term "software program" is intended to have the full breadth of its ordinary meaning, and includes any type of program instructions, code, script and/or data, or combinations thereof, that may be stored in a memory medium and executed by a processor or computer system. Exemplary software programs include: programs written in text-based programming languages such as C, C++, Java™, Pascal, Fortran, Perl, etc.; graphical programs (programs written in graphical programming languages); assembly language programs; programs that have been compiled to machine language; scripts; and other types of executable software. A software program may comprise two or more sub-programs that interoperate in a specified manner.

Hardware Configuration Program—a program, e.g., a netlist or bit file, that can be used to program or configure a programmable hardware element.

Computer System—any of various types of computing or processing systems, including a personal computer (PC), a mainframe computer system, a workstation, a laptop, a network appliance, an Internet appliance, a hand-held or mobile device, a personal digital assistant (PDA), a television system, a grid computing system, or other device or combinations of devices. In general, the term "computer system" can be broadly defined to encompass any device (or combination of devices) having at least one processor that is configured to execute instructions that are stored on a memory medium.

Measurement Device—includes instruments, data acquisition devices, smart sensors and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card, a video capture board, a smart camera, a motion control device, a robot having machine vision, and other similar types of devices. Exemplary "stand-alone" instruments include oscilloscopes, multimeters, signal analyzers, signal demodulators, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, e.g., may receive and analyze data, and issue automation control signals in response.

The presently disclosed embodiments may be realized in any of various forms. For example, any of the various embodiments may be realized as a computer-implemented method, a computer-readable memory medium, or a computer system. Furthermore, any of the presently disclosed embodiments may be realized using one or more custom-designed hardware devices such as ASICs and/or using one or more programmable hardware elements such as FPGAs.

A computer-readable memory medium is a memory medium that stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a computer system may be configured to include a processor (or a set of processors) and a memory medium. The memory medium stores program instructions. The processor is configured to read and execute the program instructions from the memory medium. The program instructions are executable by the processor to implement a method, e.g., any of the various method embodiments described herein (or, any combination of the method embodiments described herein, or, any subset of any of the method embodiments described herein, or, any combination of such subsets). The computer system may be realized in any of various forms. For example, the computer system may be a personal computer (in any of its various realizations), a workstation, a computer on a card, an application-specific computer in a box, a server computer, a client computer, a hand-held device, a mobile computing device, a tablet computer, a wearable computer, etc.

In some embodiments, a set of computers distributed across a network may be configured to partition the effort of executing a computational method (e.g., any of the method embodiments disclosed herein).

Amplitude/Phase Correlation Measurement

Figures 4, 5:
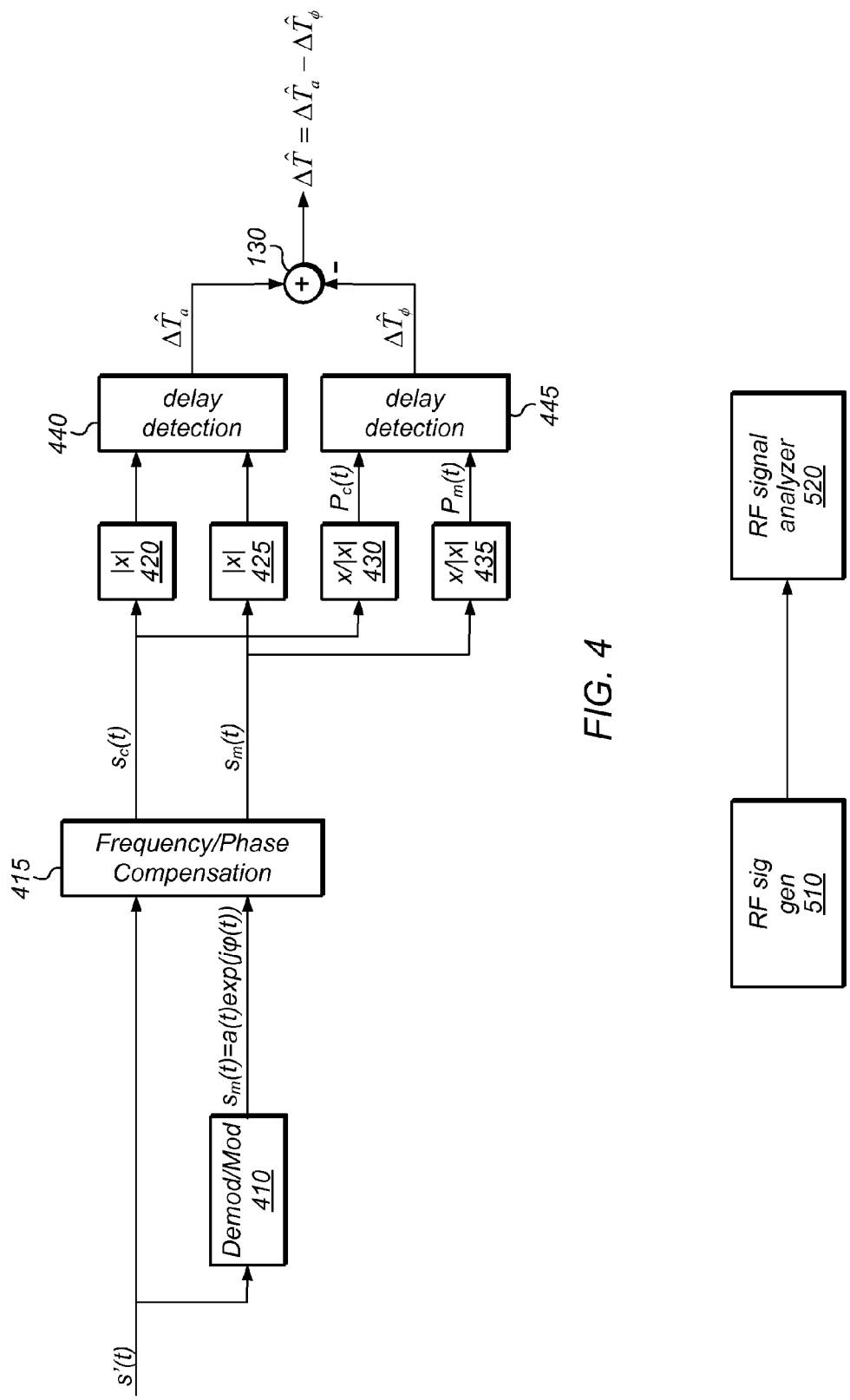
FIG. 4 illustrates one embodiment a method for estimating the time delay introduced into the amplitude path by the envelope tracking amplifier.
FIG. 5 illustrates one embodiment of a test setup used to test the method of FIG. 4.

In one set of embodiments, a method for estimating the amplitude delay $\Delta t$ of the transmitter's envelope tracking amplifier may involve the operations shown in FIG. 4. The transmitter generates a baseband signal $s(t)=a(t)\exp(j\phi(t))$ and supplies the baseband signal $s(t)$ as input to the envelope tracking amplifier. (The delay unit 117 of the envelope tracking amplifier may be set to zero delay or some other known value of delay.) The output signal $v(t)$ of envelope tracking amplifier is transmitted onto a channel. The receiver receives a baseband signal $s'(t)$ from a channel in response to the transmitter's transmission of the output signal $v(t)$. The baseband signal $s'(t)$ may be represented by the expression:

$$s'(t)=a'(t+\Delta T_a)\exp(j\phi'(t+\Delta T_\phi))\exp(j\theta)\exp(j\Delta\omega t),$$

where $a'(*)$ represents a noise-perturbed version of the amplitude envelope $a(*)$, where $\phi'(*)$ represents a noise-perturbed version of the phase signal $\phi(*)$, where $\Delta T_a$ represents the delay experienced by the amplitude envelope, where $\Delta T_\phi$ represents the delay experienced by the phase signal, where $\theta$ is the carrier phase offset, and where $\Delta\omega$ is the carrier frequency offset. (Carrier phase offset is the offset between the phase of the carrier signal generated by the receiver and the phase of the carrier signal implicit in the received RF signal. Carrier frequency offset is the offset between the frequency of the carrier signal generated by the receiver and the frequency of the carrier signal implicit in the received RF signal.)

The receiver generates a model signal $s_m(t)$ that represents an estimate for the signal $s(t)$ by demodulating the signal $s'(t)$ to obtain a stream of information bits and modulating the stream of information bits using the same modulation scheme employed by the transmitter. (See demod/mod unit 410 of FIG. 4.) In one alternative embodiment, the receiver is assumed to know (or have access to) the information bits that the transmitter used to generate the signal $s(t)$. (For example, a control computer that is responsible for directing the calibration procedure on the UUT may provide the information bits to the transmitter and the receiver.) Thus, in this alternative embodiment, the receiver may generate the model signal $s_m(t)$ more directly, by modulating the known information bits.

The frequency/phase compensation unit 415 operates on the received signal s'(t) to remove the carrier frequency offset $\Delta\omega$ and the carrier phase offset $\theta$ from the received signal s'(t). The result of that removal operation is a compensated signal $s_c(t)$, which may be represented by the expression:

$$s_c(t)=a'(t+\Delta T_a)\exp(j\phi'(t+\Delta T_\phi)).$$

In some embodiments, the model signal $s_m(t)$ may be used by the compensation unit 415 in the process of removing the carrier frequency offset and the carrier phase offset from the received signal s'(t). Algorithms for performing carrier frequency offset and carrier phase offset compensation with and without a model signal are well known to those of ordinary skill in the art of signal processing.

The compensated signal $s_c(t)$ may be provided to envelope extraction unit 420 and phase extraction unit 430, while model signal $s_m(t)$ may be provided to envelope extraction unit 425 and phase extraction unit 435.

Envelope extraction unit 420 operates on the compensated signal $s_c(t)$ to extract the envelope signal $a'(t+\Delta T_a)$. Similarly, envelope extraction unit 425 operates on the model signal $s_m(t)$ to extract the envelope signal $a(t)$.

Phase extraction unit 430 operates on the compensated signal $s_c(t)$ to obtain a compensated phase signal $P_c(t)$, and phase extraction unit 435 operates on the model signal $s_m(t)$ to obtain a model phase signal $P_m(t)$. There are number of different ways the phase signals $P_c(t)$ and $P_m(t)$ may be derived respectively from the compensated signal $s_c(t)$ and the model signal $s_m(t)$.

In one embodiment, the phase extraction unit 430 obtains the compensated phase signal $P_c(t)$ by extracting the phase signal $\exp(j\phi'(t+\Delta T_\phi))$ from the compensated signal $s_c(t)$; and phase extraction unit 435 obtains the model phase signal $P_m(t)$ by extracting the phase signal $\exp(j\phi(t))$ from the model signal $s_m(t)$. In other words, $$P_c(t)=\exp(j\phi'(t+\Delta T_\phi)),$$

$$P_m(t)=\exp(j\phi(t)).$$

In one alternative embodiment, the phase extraction unit 430 obtains the compensated phase signal $P_c(t)$ by extracting the phase signal $\phi'(t+\Delta T_\phi)$ from the compensated signal $s_c(t)$; and phase extraction unit 435 obtains the model phase signal $P_m(t)$ by extracting the phase signal $\phi(t)$ from the model signal $s_m(t)$. In other words, $$P_c(t)=\phi'(t+\Delta T_\phi),$$

$$P_m(t)=\phi(t).$$

In yet another alternative embodiment, the phase extraction unit 430 obtains the compensated phase signal $P_c(t)$ by computing the differential of the compensated signal $s_c(t)$; and phase extraction unit 435 obtains the model phase signal $P_m(t)$ by computing the differential of the model signal $s_m(t)$. In other words, $$P_c(t)=Ds_c(t),$$

$$P_m(t)=Ds_m(t),$$

where D denotes the differential operator. The differential of any signal x(t) may be computed based on samples {x(k)} of the signal x(t) according to the relation:

$$Dx(k)=x(k)x(k-1)^*,$$

where the superscript "*" denotes complex conjugation.

The delay detection unit 440 operates on the envelope signals $a'(t+\Delta T_a)$ and $a(t)$ to obtain an estimate $\Delta\hat{T}_a$ of the amplitude delay $\Delta T_a$ by performing a correlation operation on the envelope signals. The correlation operation may be performed in the time domain or in the frequency domain. In the time domain embodiment, the envelope signals are correlated to obtain a correlation function that is parameterized by separation time. The separation time that corresponds to the location of the dominant peak in the correlation function defines the estimate of the amplitude delay $\Delta T_a$. In the frequency domain embodiment, the envelope signals are transformed to the frequency domain (by application of the Fourier transform) to obtain corresponding spectra $A'(\omega)$ and $A(\omega)$. The phase spectrum corresponding to the cross spectrum $A'(\omega)A(\omega)^*$ is computed, where the superscript "*" denotes complex conjugation. (Alternatively, the cross spectrum may be computed according to the expression $A(\omega)A'(\omega)^*$, where the spectrum $A'$ is conjugated.) The slope of the phase spectrum is used as an estimate for the amplitude delay $\Delta T_a$.

The delay detection unit 445 operates on the phase signals $P_c(t)$ and $P_m(t)$ to obtain an estimate $\Delta\hat{T}_\phi$ of the phase delay $\Delta T_\phi$ by performing a correlation operation on these signals. As described above, the correlation operation may be performed in the time domain or in the frequency domain.

The estimate for the amplitude delay $\Delta t$ of the transmitter's envelope tracking amplifier may be determined by subtracting the estimate $\Delta\hat{T}_\phi$ from the estimate $\Delta\hat{T}_a$:

$$\Delta\hat{t}=\Delta\hat{T}_a-\Delta\hat{T}_\phi.$$

The estimated value $\Delta\hat{t}$ may be used to program one or more registers in the transmitter (e.g., in a delay unit of the envelope tracking unit). During normal operational mode of the transmitter, the transmitter uses the value(s) stored in the register(s) to applying compensating delay(s) to the phase signal and/or the amplitude signal, to compensate for the amplitude delay $\Delta t$ experienced by the amplitude envelope in the envelope tracking amplifier.

In some embodiments, the receiver is configured to compute either the amplitude delay estimate $\Delta\hat{T}_a$ or the phase delay estimate $\Delta\hat{T}_a$ in response to a delay estimation command received from a control computer. The command includes a selection of which delay estimate (amplitude or phase) is to be computed. The receiver computes the selected delay estimate and provides that delay estimate to the control computer as output. To compute the delay estimate $\Delta\hat{t}$, the control computer may issue two delay estimation commands to the receiver, one to obtain the amplitude delay estimate and the other to obtain the phase delay estimate. The control computer may then be responsible for estimating the delay $\Delta t$ according to the relation $\Delta\hat{t}=\Delta\hat{T}_a-\Delta\hat{T}_\phi$.

Measurement Performance

Figure 6:
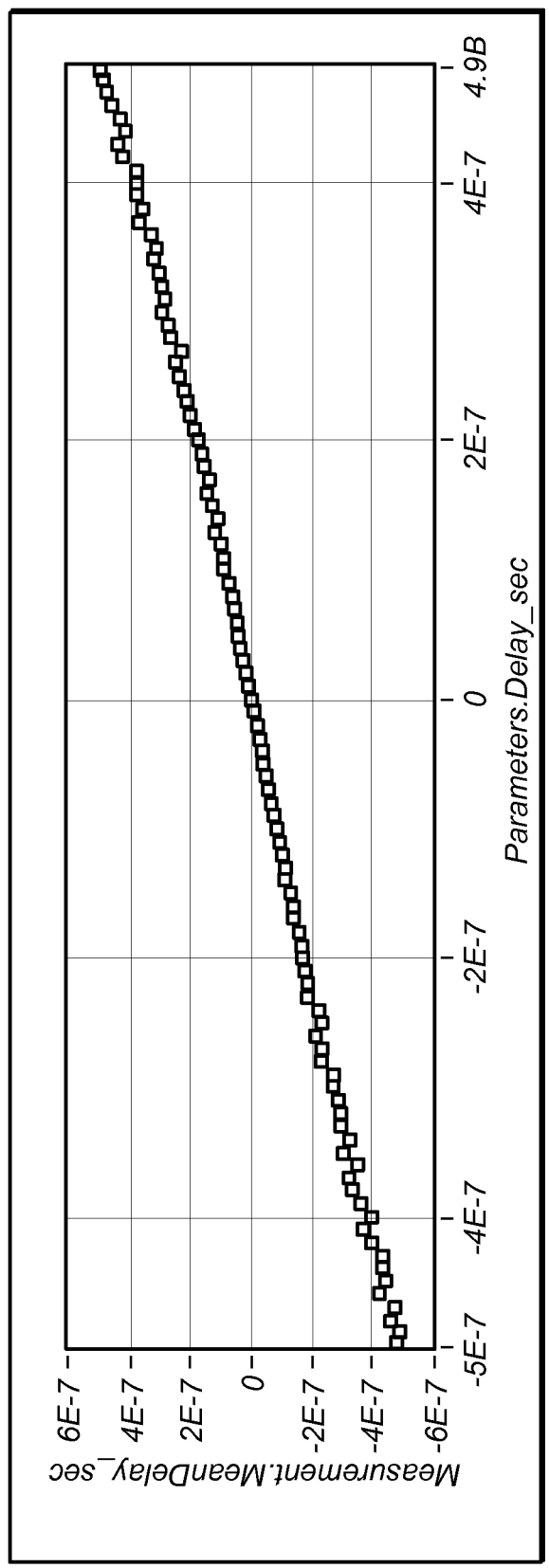
FIG. 6 is a graph of estimated delay versus actual delay obtained using the method of FIG. 4 and the test setup of FIG. 5.

In order to test the performance of the method of FIG. 4, the test setup in FIG. 5 was created. A 0 dBm single-timeslot cellular signal s(t) was generated with the PXIe-5673 vector RF signal generator 510 and presented to the PXIe-5663 vector RF signal analyzer 520. The time delay between the envelope a(t) and the phase $\phi(t)$ of the signal s(t) was varied from −500 nsec to +500 nsec, with results shown in FIG. 6. With a zero delay signal, a standard deviation better than 0.75 nsec was achieved with no averaging.

Advantages

With the procedure detailed above, assuming again the instrument can measure real time, the amount of time $T_{sc}$ required to measure the delay power for a single band, single channel, and N averages is given as:

$$T_{sc}=T_f+T_p,$$

where $T_f$ is the frame time and $T_p$ is the instrument programming time. With K bands, the total time $T_c$ required to calibrate is then:

$$T_c = KT_{sc}.$$

For a quad-band cellular radio (K=4) and a 10 msec instrument programming time, the total time required to calibrate the delay is now:

$$T_c = K(T_f + T_p)$$
$$= 4(4.615 \text{ msec} + 10 \text{ msec})$$
$$= 58.46 \text{ msec},$$

which is a fraction of the time consumed by the current method.

Figure 7:
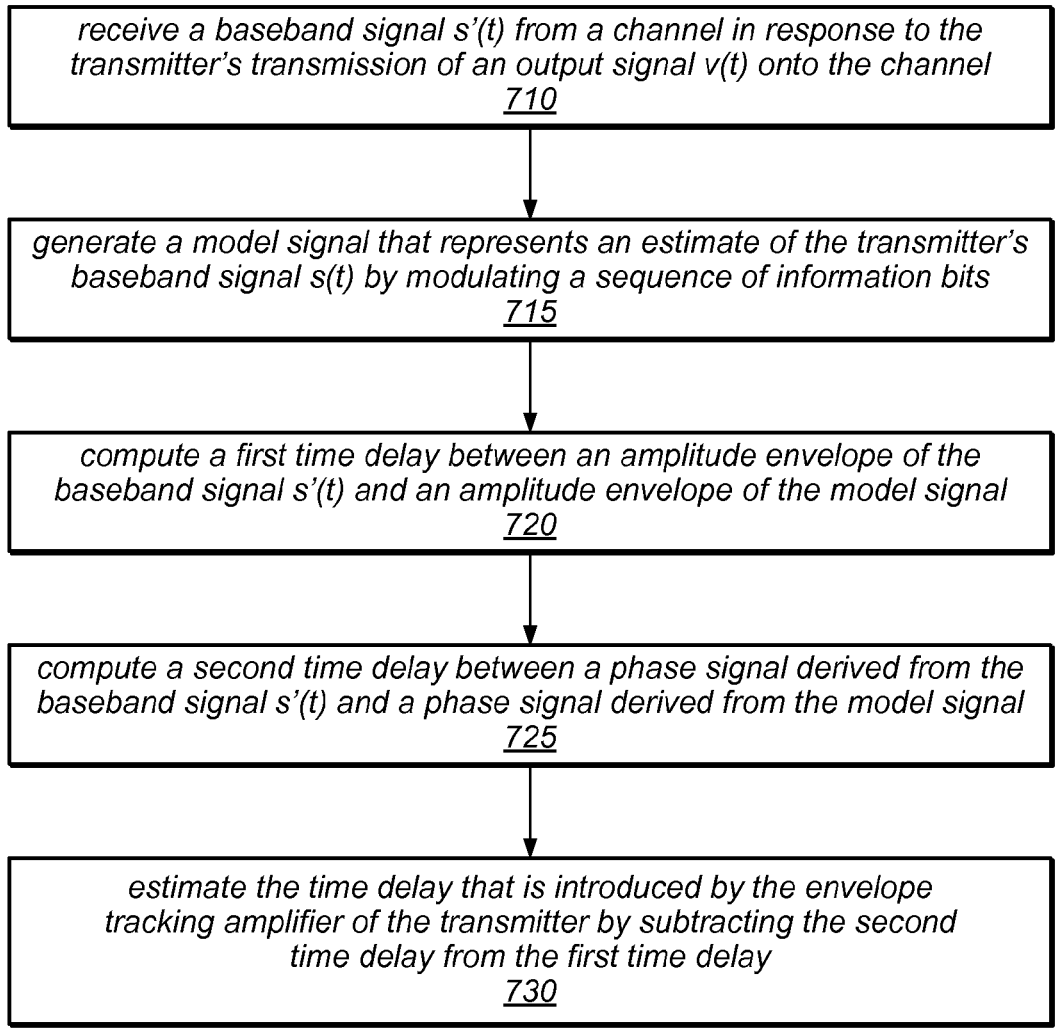
FIG. 7 illustrates one embodiment of a method for operating a receiver in order to estimate the time delay introduced into the amplitude path by the envelope tracking amplifier.

In one set of embodiments, a method for operating a receiver may involve the operations shown in FIG. 7. The method aims at estimating a time delay that is introduced by an envelope tracking amplifier of a transmitter. The envelope tracking amplifier is configured to receive a baseband signal s(t) that is generated by the transmitter and to operate on the baseband signal s(t) to produce an output signal v(t), e.g., as described above. The time delay is a delay between an amplitude envelope of the output signal v(t) and an amplitude envelope of the baseband signal s(t).

At 710, the receiver may receive a baseband signal s'(t) from a channel in response to the transmitter's transmission of the output signal v(t) onto the channel, e.g., as variously described above.

At 715, the receiver may generate a model signal that represents an estimate of the baseband signal s(t) by modulating a sequence of information bits, e.g., as variously described above.

At 720, the receiver may compute a first time delay between an amplitude envelope of the baseband signal s'(t) and an amplitude envelope of the model signal, e.g., as variously described above.

At 725, the receiver may compute a second time delay between a phase signal derived from the baseband signal s'(t) and a phase signal derived from the model signal, e.g., as variously described above.

At 730, the receiver may estimate the time delay that is introduced by the envelope tracking amplifier of the transmitter by subtracting the second time delay from the first time delay.

In some embodiments, the process of generating the model signal includes demodulating the baseband signal s'(t) in order to obtain (or recover) the sequence of information bits from the baseband signal s'(t) prior to modulating the sequence of information bits, e.g., as described above.

In some embodiments, the sequence of information bits is known to the receiver. For example, a control computer may provide the sequence of information bits to the receiver as part of a procedure of calibrating or testing the envelope tracking amplifier of the transmitter.

In some embodiments, the method of FIG. 7 may also include applying carrier frequency offset compensation and carrier phase offset compensation to the baseband signal s'(t) prior to said computing the first time delay and prior to said computing the second time delay. (See, e.g., FIG. 4.)

The receiver includes local oscillator circuitry for generating a local carrier signal. In some embodiments, that circuitry is assumed to generate the local carrier signal so that its phase and frequency closely match the phase and frequency of the carrier signal implicit in the received RF signal. In these embodiments, the carrier frequency/phase offset compensation may be omitted.

In some embodiments, the receiver is part of a calibration system that is designed to perform calibration on a series of manufactured transmitters (e.g., mobile transceivers such as cell phones). Thus, a control computer of the calibration system may direct each transmitter of the series to generate signal transmissions, and, direct the receiver to repeat operations 710 through 730 for each transmitter.

In some embodiments, the receiver or a control computer operating in association with the receiver may program the transmitter's delay compensation mechanism based on the estimated value $\Delta\hat{t}$. The delay compensation mechanism may include delay(s) that is (are) applied to the amplitude and/or phase prior to presentation of the signal s(t) to the envelope tracking amplifier, and/or, delay(s) that is (are) applied to the amplitude and/or phase in the envelope tracking amplifier.

In some embodiments, the envelope tracking amplifier includes a delay unit that is configured to delay a phase trajectory $\phi(t)$ of the baseband signal s(t) by an amount of time that is determined by a value stored in a register of the transmitter. In these embodiments, the receiver or control computer may write the estimated value of the time delay to the register. During a normal operational mode of the transmitter, delay unit may delay the phase trajectory $\phi(t)$ in order to compensate for the delay $\Delta t$ experienced by the amplitude envelope in the envelope tracking amplifier (e.g., in the switched-mode power supply of the envelope tracking amplifier).

Figure 8:
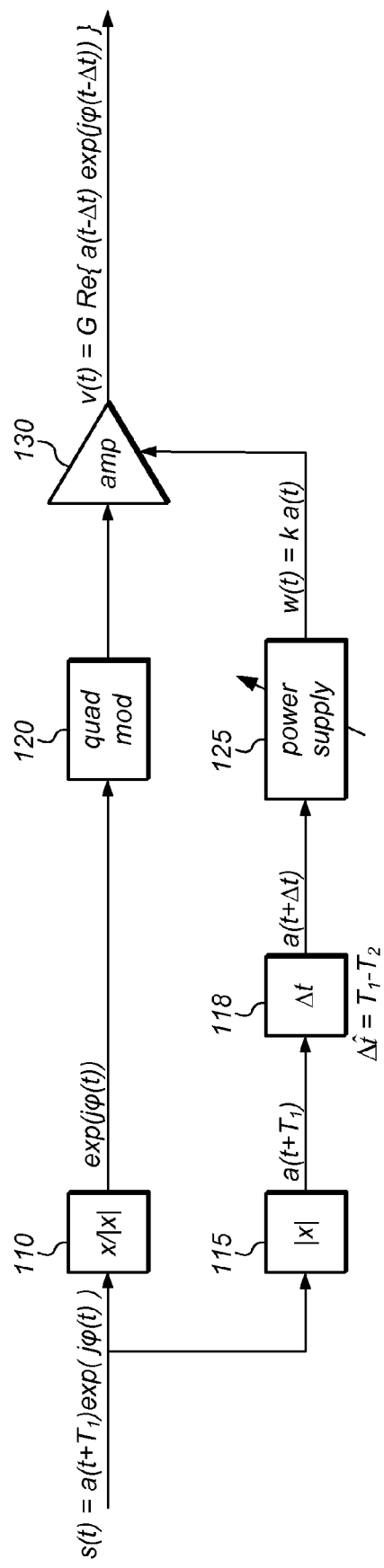
FIG. 8 illustrates one embodiment of the envelope tracking amplifier.

It is noted that the delay unit of the envelope tracking amplifier need not be situated along the phase path. It may alternatively be situated along the amplitude path, to intentionally delay the amplitude envelope in addition to the delay $\Delta t$ introduced by the switched-mode power supply, e.g., as shown in FIG. 8. In this alternative embodiment, the transmitter may: shift the amplitude envelop a(t) by a positive amount $T_1$ to the left (in the −t direction) to obtain a shifted amplitude envelope $a(t+T_1)$; compose the signal $s(t)=a(t+T_1)\exp(j\phi(t))$; provide the signal s(t) to the input of the envelope tracking amplifier of FIG. 8. The delay unit 118 is programmed to delay the amplitude envelope $a(t+T_1)$ by an amount $T_2$. Thus, the output of the delay unit is $a(t+T_1-T_2)$. However, the value of $T_2$ is selected so that $T_1-T_2=\Delta\hat{t}$. Therefore, $a(t+T_1-T_2)=a(t+\Delta\hat{t})$. Because the power supply 125 has delay $\Delta t$, and $\Delta\hat{t}$ is approximately equal to $\Delta t$, the amplitude envelope and the phase signal will be in phase at the amplifier 130:

$$a(t+\Delta\hat{t}-\Delta t) \cong a(t).$$

The receiver (or a control computer operating in association with the receiver) may write the value $T_2=T_1-\Delta\hat{t}$ to the register that controls the delay unit 118. In the context of a calibration system, the method of FIG. 7 may be applied to each of a series of transmitters. The same value $T_1$ may be used in each of the transmitters. However, the value $T_1$ may be selected (at system design time) to be large enough so that $T_2=T_1-\Delta\hat{t}$ is guaranteed to be positive over the expected range of variation of $\Delta\hat{t}$.

In one embodiment, the action of generating the estimate $\Delta\hat{t}$ and the action of writing the estimate $\Delta\hat{t}$ to the delay control register may be performed at a manufacturing site prior to shipping the transmitter to a user. In another embodiment, those actions may be performed at a user site when a user invokes a self test/calibration.

In some embodiments, the action of computing the first time delay includes: computing a correlation function between the amplitude envelope of the baseband signal s'(t) and the amplitude envelope of the model signal; and locating a dominant peak in the correlation function, e.g., as described above.

In some embodiments, the action of computing the first time delay includes: computing a cross spectrum between the amplitude envelope of the baseband signal s'(t) and the amplitude envelope of the model signal; and determining the first time delay based on an analysis of the cross spectrum, e.g., as described above.

In some embodiments, the action of computing the second time delay includes: computing a correlation function between the phase signal derived from the baseband signal s'(t) and the phase signal derived from the model signal; and locating a dominant peak in the correlation function, e.g., as described above.

In some embodiments, the action of computing the second time delay includes: computing a cross spectrum between the phase signal derived from the baseband signal s'(t) and the phase signal derived from the model signal; and determining the second time delay based on an analysis of the cross spectrum, e.g., as described above.

In some embodiments, the channel between the transmitter and the receiver is a wireless channel. In other embodiments, the channel is a wired channel.

In some embodiments, the phase signal derived from the baseband signal s'(t) is a differential of the baseband signal s'(t), and the phase signal derived from the model signal is a differential of the model signal.

In various embodiments, the transmitter and receiver are configured to modulate/demodulate signals based on any of a wide variety of communication standards, e.g., standards such as GSM, EDGE, WCDMA, LTE, WIMAX, etc.

Figure 9:
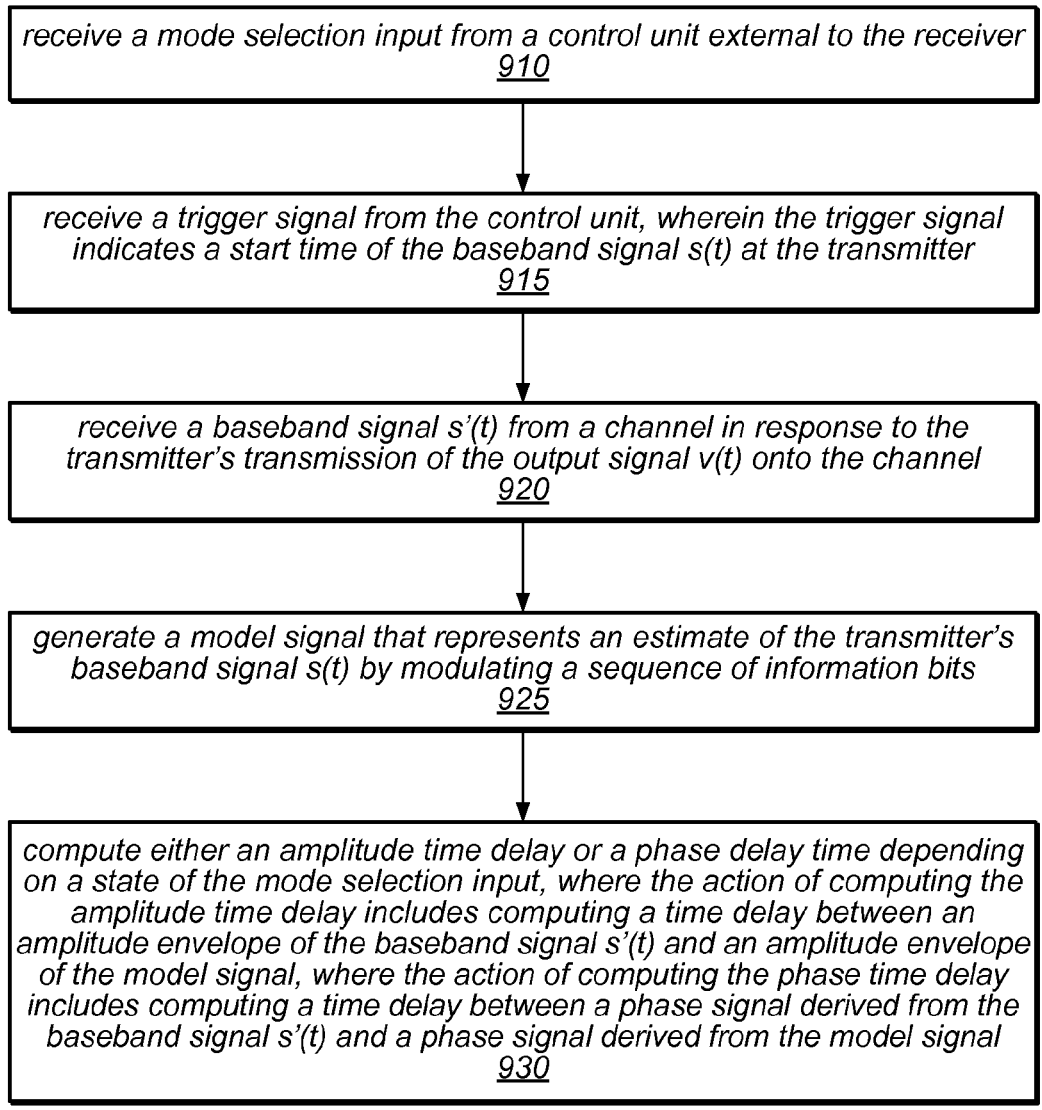
FIG. 9 illustrates one embodiment of a method for operating a receiver in order to estimate one of an amplitude time delay or a phase time delay in response to a selection command that specifies which delay is to be computed.

In one set of embodiments, a method for operating a receiver may involve the operations shown in FIG. 9. It is assumed that the receiver receives a transmission from a transmitter that includes an envelope tracking amplifier, e.g., as variously described above. The envelope tracking amplifier is configured to receive a baseband signal s(t) that is generated by the transmitter and to operate on the baseband signal s(t) to produce an output signal v(t).

At 910, the receiver receives a mode selection input from a control unit external to the receiver, e.g., from a control computer that is responsible for directing a calibration procedure, that procedure involving the coordination of the actions of the transmitter and the receiver.

At 915, the receiver receives a trigger signal from the control unit, wherein the trigger signal indicates a start time of the baseband signal s(t) at the transmitter.

At 920, the receiver receives a baseband signal s'(t) from a channel in response to the transmitter's transmission of the output signal v(t) onto the channel.

At 925, the receiver generates a model signal that represents an estimate of the baseband signal s(t) by modulating a sequence of information bits, e.g., in response to receiving the trigger signal. The model signal may be generated as variously described above.

At 930, the receiver computes either an amplitude time delay or a phase delay time depending on a state of the mode selection input. The action of computing the amplitude time delay includes computing a time delay between an amplitude envelope of the baseband signal s'(t) and an amplitude envelope of the model signal, e.g., as variously described above. The action of computing the phase time delay includes computing a time delay between a phase signal derived from the baseband signal s'(t) and a phase signal derived from the model signal, e.g., as variously described above. The receiver may send (or make available) the computed time delay to the control unit.

The control unit may invoke the method of FIG. 9 twice, once to obtain the amplitude time delay and once to obtain the phase time delay. The control unit may then compute the estimate $\Delta \hat{t}$ for the time delay $\Delta t$ of the switched-mode power supply by subtracting the phase time delay from the amplitude time delay. The control unit may then program the transmitter's delay compensation mechanism based on the estimated value $\Delta \hat{t}$, e.g., as variously described above. The delay compensation mechanism may include delay(s) that is (are) applied to the amplitude and/or phase prior to presentation of the signal s(t) to the envelope tracking amplifier, and/or, delay(s) that is (are) applied to the amplitude and/or phase in the envelope tracking amplifier.

In some embodiments, the receiver and control unit are part of a calibration system that is designed to perform calibration on a series of manufactured transmitters (e.g., mobile transceivers such as cell phones). Thus, the control unit may direct each transmitter of the series to generate signal transmissions, and, direct the receiver to twice repeat operations 910 through 930 for each transmitter. The two repetitions include one repetition for obtaining the amplitude time delay and one repetition for obtaining the phase time delay.

In some embodiments, the method of FIG. 9 may also include applying carrier frequency offset compensation and carrier phase offset compensation to the baseband signal s'(t), e.g., as variously described above. These compensation steps are performed prior to the computation of the selected time delay.

As described above, the receiver includes local oscillator circuitry for generating a local carrier signal. In some embodiments, that circuitry is assumed to generate the local carrier signal so that its phase and frequency closely match the phase and frequency of the carrier signal implicit in the received RF signal. In these embodiments, the carrier frequency/phase offset compensation may be omitted.

In some embodiments, the channel between the transmitter and the receiver is a wireless channel. In other embodiments, the channel is a wired channel.

In some embodiments, the phase signal derived from the baseband signal s'(t) is a differential of the baseband signal s'(t), and the phase signal derived from the model signal is a differential of the model signal.

In various embodiments, the transmitter and receiver are configured to modulate/demodulate signals based on any of a wide variety of communication standards, e.g., standards such as GSM, EDGE, WCDMA, LTE, WIMAX, etc.

Figure 10:
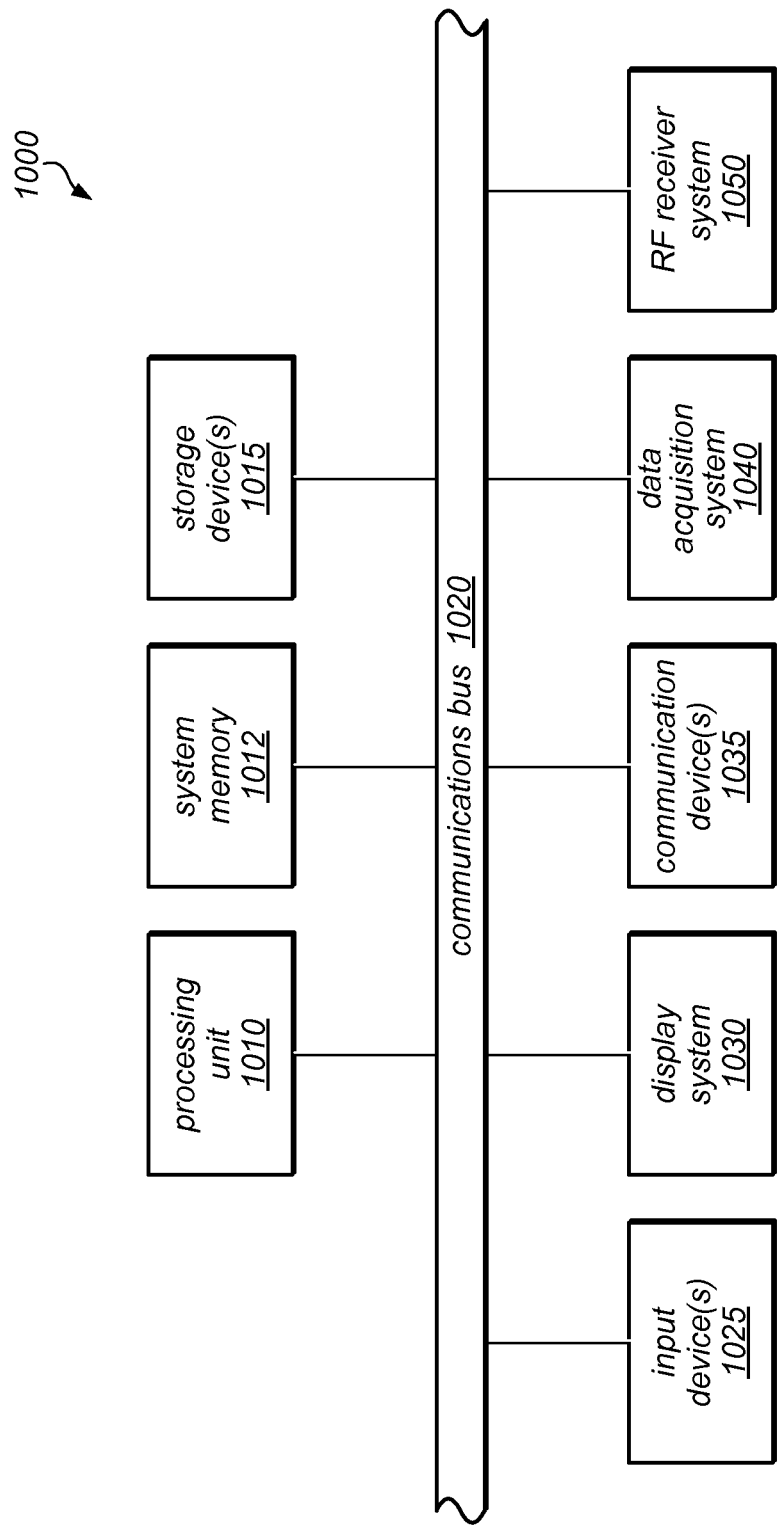
FIG. 10 illustrates one embodiment of a computer system that may be used to perform any of the various method embodiments disclosed herein.

FIG. 10 illustrates one embodiment of a computer system 1000 that may be used to perform any of the method embodiments described herein, or, any combination of the method embodiments described herein, or any subset of any of the method embodiments described herein, or, any combination of such subsets.

Computer system 1000 may include a processing unit 1010, a system memory 1012, a set 1015 of one or more storage devices, a communication bus 1020, a set 1025 of input devices, and a display system 1030.

System memory 1012 may include a set of semiconductor devices such as RAM devices (and perhaps also a set of ROM devices).

Storage devices 1015 may include any of various storage devices such as one or more memory media and/or memory access devices. For example, storage devices 1015 may include devices such as a CD/DVD-ROM drive, a hard disk, a magnetic disk drive, magnetic tape drives, etc.

Processing unit 1010 is configured to read and execute program instructions, e.g., program instructions stored in system memory 1012 and/or on one or more of the storage devices 1015. Processing unit 1010 may couple to system memory 1012 through communication bus 1020 (or through a system of interconnected busses). The program instructions configure the computer system 1000 to implement a method, e.g., any of the method embodiments described herein, or, any combination of the method embodiments described herein, or, any subset of any of the method embodiments described herein, or any combination of such subsets.

Processing unit 1010 may include one or more processors (e.g., microprocessors).

One or more users may supply input to the computer system 1000 through the input devices 1025. Input devices 1025 may include devices such as a keyboard, a mouse, a touch-sensitive pad, a touch-sensitive screen, a drawing pad, a track ball, a light pen, a data glove, eye orientation and/or head orientation sensors, a microphone (or set of microphones), or any combination thereof.

The display system 1030 may include any of a wide variety of display devices representing any of a wide variety of display technologies. For example, the display system may be a computer monitor, a head-mounted display, a projector system, a volumetric display, or a combination thereof. In some embodiments, the display system may include a plurality of display devices. In one embodiment, the display system may include a printer and/or a plotter.

In some embodiments, the computer system 1000 may include other devices, e.g., devices such as one or more graphics accelerators, one or more speakers, a sound card, a video camera and a video card.

In some embodiments, computer system 1000 may include one or more communication devices 1035, e.g., a network interface card for interfacing with a computer network. In one embodiment, computer system 1000 may receive an input signal and perform signal processing operations on the modulated signal using such a communication device.

In some embodiments, the communication devices may include a reconfigurable I/O (RIO) board that includes one or more programmable hardware elements (PHEs), one or more A/D converters and additional circuitry. The RIO board is programmable to achieve a user-desired configuration of input and/or output processing, e.g., via a program written using LabVIEW FPGA. In some embodiments, the additional circuitry of the RIO board may include circuitry optimized for various kinds of signal processing operations and/or circuitry configured for signal amplification, carrier signal generation and synchronization, clock signal generation and synchronization, RF down-conversion, any of various kinds of demodulation, etc. The RIO board may receive an input signal, down-convert the input signal to baseband, digitize the baseband signal, and make the digitized baseband samples available to the computer system 1000 for further processing, e.g., processing according to any of the method embodiments disclosed herein.

In some embodiments, the reconfigurable I/O board is one of the RIO boards provided by National Instrument Corporation.

The computer system may be configured with a software infrastructure including an operating system, and perhaps also, one or more graphics APIs (such as OpenGL®, Direct3D, Java 3D™). In some embodiments, the software infrastructure may include LabVIEW and/or LabVIEW FPGA, which are software products of National Instruments Corporation.

In some embodiments, the computer system 1000 may be configured for coupling to a data acquisition system 1040. The data acquisition system 1040 is configured to receive analog inputs signals, to digitize the analog input signals, and to make those digitized signals available to the computer system 1000. The data acquisition system 1040 may operate under the control of the software executing on processor 1010.

In some embodiments, the computer system 1000 may be configured to interface with a receiver system 1050, e.g., an off-the-shelf receiver system designed for capturing radiated electromagnetic signals (such as RF signals, wireless LAN signals, etc.), down-converting the captured signals, and sampling the down-converted signals. In one embodiment, the receiver system 1050 may be realized by a vector signal analyzer such as the NI PXIe-5663 or the NI PXIe-5663E provided by National Instruments Corporation.

Figure 11:
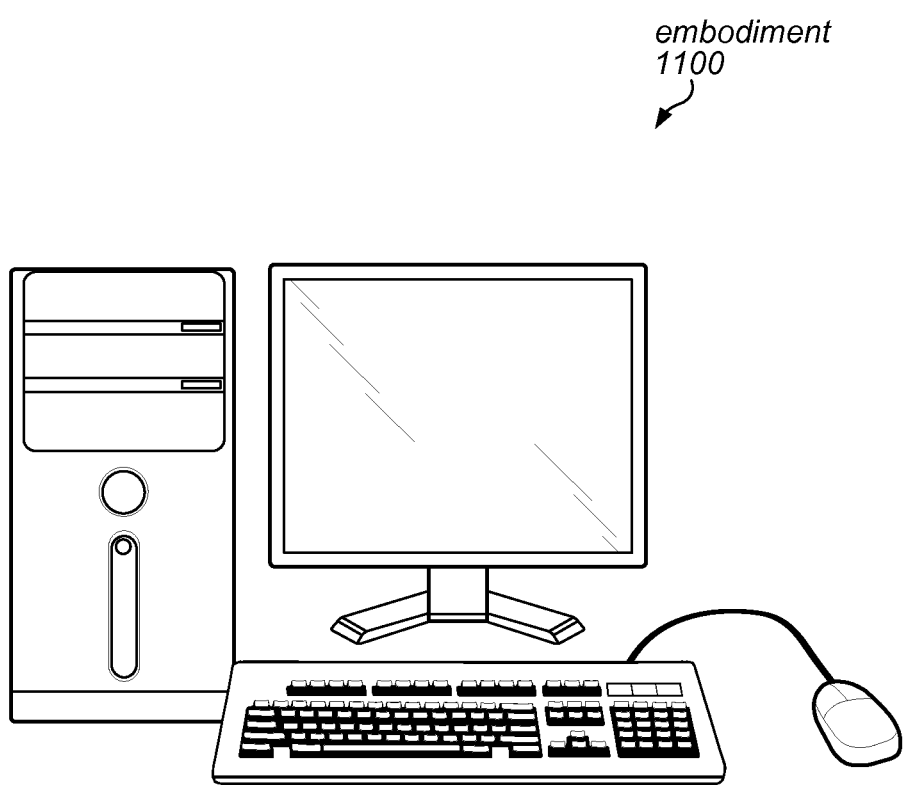
FIG. 11 illustrates an embodiment 1100 of the computer system 1000 shown in FIG. 10.

FIG. 11 illustrates one possible embodiment 1100 for computer system 1000.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method for operating a computer system in order to estimate a time delay that is introduced by an envelope tracking amplifier of a transmitter, wherein the envelope tracking amplifier is configured to receive a first baseband signal that is generated by the transmitter and to operate on the first baseband signal to produce an output signal, the method comprising:

utilizing a computer to perform:
receiving a second baseband signal from a channel in response to a transmission of the output signal onto the channel, wherein said transmission is performed by the transmitter;
generating a model signal that represents an estimate of the first baseband signal by modulating a sequence of information bits;
computing a first time delay between an amplitude envelope of the second baseband signal and an amplitude envelope of the model signal;
computing a second time delay between a phase signal derived from the second baseband signal and a phase signal derived from the model signal; and
estimating the time delay that is introduced by the envelope tracking amplifier of the transmitter by subtracting the second time delay from the first time delay;
wherein the estimated time delay is used to program operation of the transmitter.

2. The method of claim 1, wherein said generating the model signal includes:
demodulating the second baseband signal in order to obtain the sequence of information bits from the second baseband signal prior to said modulating the sequence of information bits.

3. The method of claim 1, further comprising:
applying carrier frequency offset compensation and carrier phase offset compensation to the second baseband signal prior to said computing the first time delay and prior to said computing the second time delay.

4. The method of claim 1, further comprising:
storing the estimated time delay in the transmitter, wherein the estimated time delay is used to delay a phase trajectory of the first baseband signal.

5. The method of claim 1, further comprising:
storing the estimated time delay in the transmitter, wherein the estimated time delay is used to delay the amplitude envelope of the first baseband signal.

6. The method of claim 1, further comprising:
repeating said receiving, said generating, said computing the first time delay, said computing the second time delay and said estimating for each of a series of manufactured transmitters.

7. The method of claim 1, wherein the phase signal derived from the second baseband signal is a differential of the second baseband signal, wherein the phase signal derived from the model signal is a differential of the model signal.

8. A non-transitory computer-readable memory medium for operating a computer system in order to estimate a time delay that is introduced by an envelope tracking amplifier of a transmitter, wherein the envelope tracking amplifier is configured to receive a first baseband signal that is generated by the transmitter and to operate on the first baseband signal to produce an output signal, wherein the non-transitory memory medium stores program instructions, wherein the program instructions, when executed by the computer system, cause the computer system to:
receive a second baseband signal from a channel in response to a transmission of the output signal onto the channel, wherein said transmission is performed by the transmitter;
generate a model signal that represents an estimate of the first baseband signal by modulating a sequence of information bits;
compute a first time delay between an amplitude envelope of the second baseband signal and an amplitude envelope of the model signal;
compute a second time delay between a phase signal derived from the second baseband signal and a phase signal derived from the model signal; and
estimate the time delay that is introduced by the envelope tracking amplifier of the transmitter by subtracting the second time delay from the first time delay;
wherein the estimated time delay is used to program operation of the transmitter.

9. The non-transitory memory medium of claim 8, wherein, in said generation of the model signal, the program instructions are further executable to:
demodulate the second baseband signal in order to obtain the sequence of information bits from the second baseband signal prior to said modulating the sequence of information bits.

10. The non-transitory memory medium of claim 8, wherein the program instructions are further executable to:
apply carrier frequency offset compensation and carrier phase offset compensation to the second baseband signal prior to said computing the first time delay and prior to said computing the second time delay.

11. The non-transitory memory medium of claim 8, wherein the phase signal derived from the second baseband signal is a differential of the second baseband signal, wherein the phase signal derived from the model signal is a differential of the model signal.

12. A computer system for operating a computer system in order to estimate a time delay that is introduced by an envelope tracking amplifier of a transmitter, wherein the envelope tracking amplifier is configured to receive a first baseband signal that is generated by the transmitter and to operate on the first baseband signal to produce an output signal, the computer system comprising:
a processor; and
memory storing program instructions, wherein the program instructions, when executed by the processor, cause the processor to:
receive a second baseband signal from a channel in response to a transmission of the output signal onto the channel, wherein said transmission is performed by the transmitter;
generate a model signal that represents an estimate of the first baseband signal by modulating a sequence of information bits;
compute a first time delay between an amplitude envelope of the second baseband signal and an amplitude envelope of the model signal;
compute a second time delay between a phase signal derived from the second baseband signal and a phase signal derived from the model signal; and
estimate the time delay that is introduced by the envelope tracking amplifier of the transmitter by subtracting the second time delay from the first time delay;
wherein the estimated time delay is used to program operation of the transmitter.

13. The computer system of claim 12, wherein the program instructions are further executable to:
applying carrier frequency offset compensation and carrier phase offset compensation to the second baseband signal prior to said computing the first time delay and prior to said computing the second time delay.

14. The computer system of claim 12, wherein the phase signal derived from the second baseband signal is a differential of the second baseband signal, wherein the phase signal derived from the model signal is a differential of the model signal.

15. A method for operating a computer system that receives a transmission from a transmitter that includes an envelope tracking amplifier, wherein the envelope tracking amplifier is configured to receive a first baseband signal that is generated by the transmitter and to operate on the first baseband signal to produce an output signal, the method comprising:
utilizing a computer to perform:
receiving a mode selection input from a control unit;
receiving a trigger signal from the control unit, wherein the trigger signal indicates a start time of the first baseband signal at the transmitter;
receiving a second baseband signal from a channel in response to a transmission of the output signal onto the channel, wherein said transmission is performed by the transmitter;
generating a model signal that represents an estimate of the first baseband signal by modulating a sequence of information bits in response to receiving the trigger signal; and
computing either an amplitude time delay or a phase delay time depending on a state of the mode selection input, wherein said computing the amplitude time delay includes computing a time delay between an amplitude envelope of the second baseband signal and an amplitude envelope of the model signal, wherein said computing the phase time delay includes computing a time delay between a phase signal derived from the second baseband signal and a phase signal derived from the model signal.

16. The method of claim 15, further comprising:
sending the computed time delay to the control unit.

17. A non-transitory computer-readable memory medium for operating a computer system that receives a transmission from a transmitter that includes an envelope tracking amplifier, wherein the envelope tracking amplifier is configured to receive a first baseband signal that is generated by the transmitter and to operate on the first baseband signal to produce an output signal, wherein the non-transitory memory medium stores program instructions, wherein the program instructions, when executed by the computer system, cause the computer system to:

receive a mode selection input from a control unit;

receive a trigger signal from the control unit, wherein the trigger signal indicates a start time of the first baseband signal at the transmitter;

receive a second baseband signal from a channel in response to a transmission of the output signal onto the channel, wherein said transmission is performed by the transmitter;

generate a model signal that represents an estimate of the first baseband signal by modulating a sequence of information bits in response to receiving the trigger signal; and compute either an amplitude time delay or a phase delay time depending on a state of the mode selection input, wherein said computing the amplitude time delay includes computing a time delay between an amplitude envelope of the second baseband signal and an amplitude envelope of the model signal, wherein said computing the phase time delay includes computing a time delay between a phase signal derived from the second baseband signal and a phase signal derived from the model signal.

18. The non-transitory memory medium of claim 17, wherein the program instructions are further executable to:
send the computed time delay to the control unit.

19. The non-transitory memory medium of claim 17, wherein, in generation of the model signal, the program instructions are further executable to:
demodulate the second baseband signal in order to obtain the sequence of information bits from the second baseband signal prior to said modulating the sequence of information bits.

20. The non-transitory memory medium of claim 17, wherein the program instructions are further executable to:
apply carrier frequency offset compensation and carrier phase offset compensation to the second baseband signal.

\* \* \* \* \*